United States Patent
Lu

(10) Patent No.: US 8,966,339 B1
(45) Date of Patent: Feb. 24, 2015

(54) DECODER SUPPORTING MULTIPLE CODE RATES AND CODE LENGTHS FOR DATA STORAGE SYSTEMS

(71) Applicant: Western Digital Technologies, Inc., Irvine, CA (US)

(72) Inventor: Guangming Lu, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 40 days.

(21) Appl. No.: 13/742,243

(22) Filed: Jan. 15, 2013

Related U.S. Application Data

(60) Provisional application No. 61/738,764, filed on Dec. 18, 2012.

(51) Int. Cl.
*H03M 13/00* (2006.01)
*H03M 13/13* (2006.01)

(52) U.S. Cl.
CPC .................................... *H03M 13/13* (2013.01)
USPC ......................................................... 714/758

(58) Field of Classification Search
CPC .. H03M 13/09; H03M 13/091; H04L 1/0061; H04L 1/0057; H04L 1/0045
USPC ......................................................... 714/758
See application file for complete search history.

(56) References Cited

U.S. PATENT DOCUMENTS

| | | |
|---|---|---|
| 6,856,556 B1 | 2/2005 | Hajeck |
| 6,895,547 B2 | 5/2005 | Eleftheriou et al. |
| 7,072,417 B1 | 7/2006 | Burd et al. |
| 7,126,857 B2 | 10/2006 | Hajeck |
| 7,346,832 B2 | 3/2008 | Richardson et al. |
| 7,395,490 B2 | 7/2008 | Richardson et al. |
| 7,430,136 B2 | 9/2008 | Merry, Jr. et al. |
| 7,447,807 B1 | 11/2008 | Merry et al. |
| 7,500,172 B2 | 3/2009 | Shen et al. |
| 7,502,256 B2 | 3/2009 | Merry, Jr. et al. |
| 7,509,441 B1 | 3/2009 | Merry et al. |
| 7,577,892 B1 | 8/2009 | He |

(Continued)

FOREIGN PATENT DOCUMENTS

WO 2011127297 A1 10/2011

OTHER PUBLICATIONS

U.S. Appl. No. 13/918,400, filed Jun. 14, 2013, 41 pages.

(Continued)

*Primary Examiner* — Albert Decady
*Assistant Examiner* — Enam Ahmed

(57) ABSTRACT

Embodiments of decoders supporting multiple code rates and code lengths for data storage systems are disclosed. The decoders can provide for flexible and scalable decoding, particularly when quasi-cyclic low-density parity-check code (QC-LDPC) decoding is used. The decoder can be scaled in size based on, for example, the desired decoding throughput and/or computational cycle duration. In one embodiment, a rotate-left/right shifter is configured to support data having processing units of one of multiple matrix sizes and independently shift portions of the data. In another embodiment, one or more decoding modules are configured to share with one or more other decoding modules an output value from a layer decoding operation. This sharing can facilitate parallel decoding of data by the decoding modules. As a result, decoding speed, efficiency, and system performance can be improved.

22 Claims, 6 Drawing Sheets

(56) References Cited

U.S. PATENT DOCUMENTS

| | | | |
|---|---|---|---|
| 7,596,643 B2 | 9/2009 | Merry, Jr. et al. | |
| 7,639,738 B2 * | 12/2009 | Lopez de Victoria | 714/746 |
| 7,653,778 B2 | 1/2010 | Merry, Jr. et al. | |
| 7,657,816 B2 | 2/2010 | Cohen et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,783,950 B2 | 8/2010 | Esumi et al. | |
| 7,814,393 B2 | 10/2010 | Kyung et al. | |
| 7,898,855 B2 | 3/2011 | Merry, Jr. et al. | |
| 7,912,991 B1 | 3/2011 | Merry et al. | |
| 7,913,149 B2 | 3/2011 | Gribok et al. | |
| 7,936,603 B2 | 5/2011 | Merry, Jr. et al. | |
| 7,962,792 B2 | 6/2011 | Diggs et al. | |
| 8,010,869 B2 | 8/2011 | Wehn et al. | |
| 8,037,388 B2 | 10/2011 | Heinrich et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,161,345 B2 | 4/2012 | Graef | |
| 8,166,245 B2 | 4/2012 | Diggs et al. | |
| 8,171,367 B2 | 5/2012 | Gao et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,347,195 B1 | 1/2013 | Varnica et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,495,479 B1 | 7/2013 | Varnica et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,583,835 B1 | 11/2013 | Kan | |
| 8,601,311 B1 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 2003/0037298 A1 | 2/2003 | Eleftheriou et al. | |
| 2003/0123563 A1 | 7/2003 | Lu | |
| 2004/0098659 A1 | 5/2004 | Bjerke et al. | |
| 2005/0204253 A1 | 9/2005 | Sukhobok et al. | |
| 2005/0216821 A1 | 9/2005 | Harada | |
| 2005/0246617 A1 | 11/2005 | Kyung et al. | |
| 2006/0036925 A1 | 2/2006 | Kyung et al. | |
| 2006/0036933 A1 | 2/2006 | Blankenship et al. | |
| 2008/0172592 A1 | 7/2008 | Wehn et al. | |
| 2008/0301521 A1 | 12/2008 | Gunnam et al. | |
| 2009/0113256 A1 | 4/2009 | Radosavljevic et al. | |
| 2009/0249159 A1 | 10/2009 | Lee et al. | |
| 2009/0249160 A1 | 10/2009 | Gao et al. | |
| 2010/0037121 A1 | 2/2010 | Jin et al. | |
| 2010/0100788 A1 | 4/2010 | Yang et al. | |
| 2010/0107030 A1 | 4/2010 | Graef | |
| 2010/0131819 A1 | 5/2010 | Graef | |
| 2010/0169735 A1 | 7/2010 | Bisocondi et al. | |
| 2010/0174849 A1 | 7/2010 | Walston et al. | |
| 2010/0250793 A1 | 9/2010 | Syu | |
| 2010/0275088 A1 | 10/2010 | Graef | |
| 2010/0318872 A1 | 12/2010 | Wang | |
| 2011/0099323 A1 | 4/2011 | Syu | |
| 2011/0126067 A1 * | 5/2011 | Rezk et al. | 714/748 |
| 2011/0126078 A1 | 5/2011 | Ueng et al. | |
| 2011/0179333 A1 | 7/2011 | Wesel et al. | |
| 2011/0246862 A1 | 10/2011 | Graef | |
| 2011/0252286 A1 | 10/2011 | Li et al. | |
| 2011/0252294 A1 | 10/2011 | Ng et al. | |
| 2011/0283049 A1 | 11/2011 | Kang et al. | |
| 2012/0079341 A1 | 3/2012 | Wajcer et al. | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0297267 A1 | 11/2012 | Chinnici et al. | |
| 2012/0324191 A1 | 12/2012 | Strange et al. | |
| 2013/0031447 A1 | 1/2013 | Sharon et al. | |
| 2013/0097470 A1 * | 4/2013 | Hwang et al. | 714/758 |
| 2013/0132638 A1 | 5/2013 | Horn et al. | |
| 2013/0139026 A1 * | 5/2013 | Blanksby et al. | 714/752 |
| 2013/0145106 A1 | 6/2013 | Kan | |
| 2013/0290793 A1 | 10/2013 | Booth et al. | |
| 2014/0059405 A1 | 2/2014 | Syu et al. | |
| 2014/0115427 A1 | 4/2014 | Guangming | |

OTHER PUBLICATIONS

U.S. Appl. No. 13/718,289, filed Dec. 18, 2012, 27 pages.
U.S. Appl. No. 13/742,248, filed Jan. 15, 2013, 32 pages.
Bernhard M.J. Leiner, "LDPC Codes—a brief Tutorial", Stud. ID: 53418L, Apr. 8, 2005, pp. 1-9.

* cited by examiner

DECODER SUPPORTING MULTIPLE CODE RATES AND CODE LENGTHS FOR DATA STORAGE SYSTEMS

CROSS REFERENCE TO RELATED APPLICATIONS

This application claims benefit under 35 U.S.C. §119(e) to U.S. Provisional Patent Application No. 61/738,764 entitled "DECODER SUPPORTING MULTIPLE CODE RATES AND CODE LENGTHS FOR DATA STORAGE SYSTEMS" filed on Dec. 18, 2012; the disclosure of which is hereby incorporated by reference in its entirety.

BACKGROUND

1. Technical Field

This disclosure relates to data storage systems for computer systems. More particularly, the disclosure relates to a decoder supporting multiple code rates and code lengths.

2. Description of the Related Art

Non-volatile memory arrays often have limited endurance. The endurance of the memory array is typically contingent on usage pattern and wear. In addition, the endurance depends on a type of the non-volatile memory array used. For example, memory arrays with multi-level cell (MLC) NAND media typically have a lower endurance than memory arrays with single-level cell (SLC) NAND media. To protect user data stored to memory arrays from corruption, which may be caused by a diminished endurance, parity data can be generated and stored along with user data to facilitate error detection and/or correction. Decoding of parity data can be time consuming and resource intensive. Accordingly, it is desirable to provide more efficient mechanisms for decoding parity data.

BRIEF DESCRIPTION OF THE DRAWINGS

Systems and methods that embody the various features of the invention will now be described with reference to the following drawings, in which.

DETAILED DESCRIPTION

Figure 1:
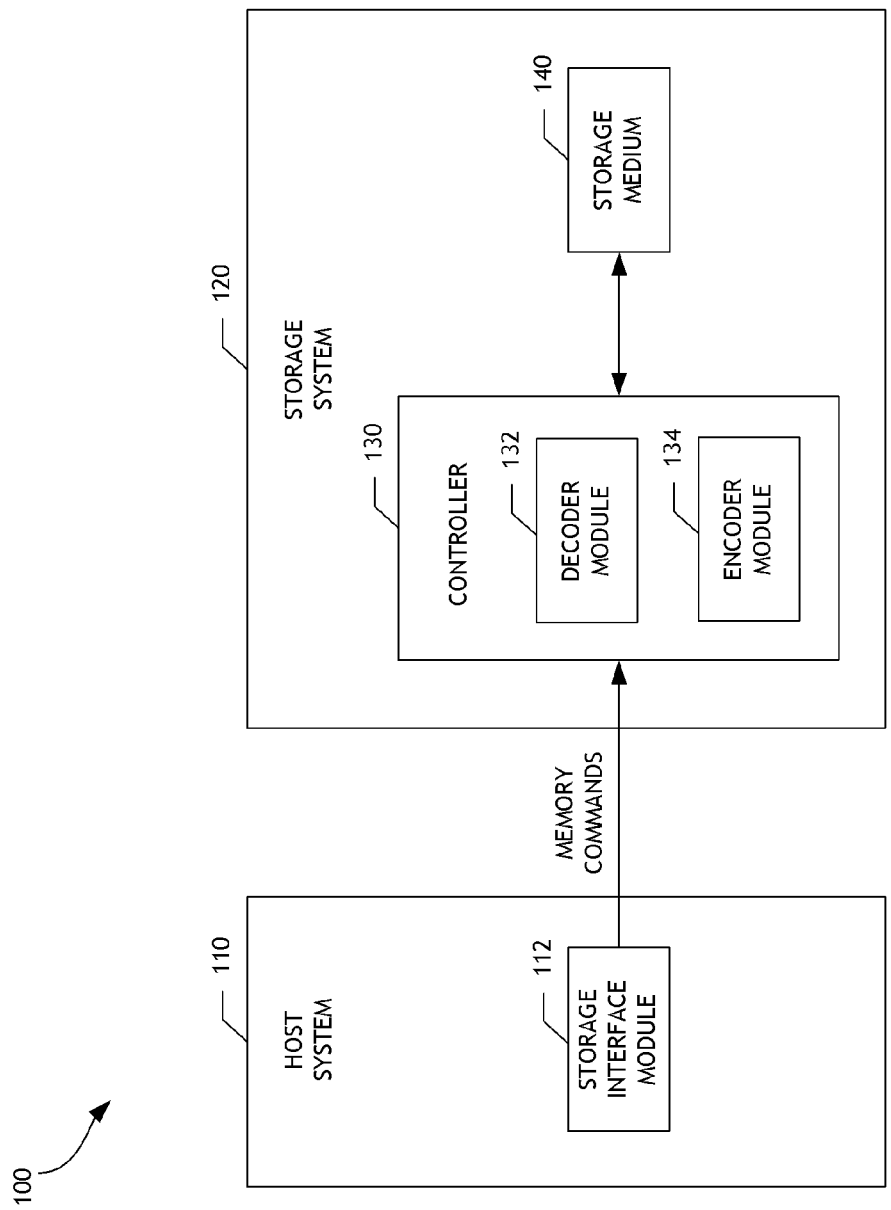
FIG. 1 illustrates a combination of a host system and a data storage system that implements a decoder supporting multiple code rates and code lengths according to one embodiment of the invention.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems, such as solid state drives, typically include one or more controllers coupled with one or more non-volatile memory arrays. Depending on the type of non-volatile memory array used, stored data may be subject to corruption as a result of, for example, read/write disturbs, loss of data retention, and/or loss of endurance. Data storage systems can utilize one or more error correction or error coding mechanisms to detect and/or correct errors in the stored data. One such mechanism can determine parity data, such as parity data, when writing user data. Parity data can be stored, for example, in a memory array. When stored user data is retrieved, parity data can be utilized as part of a decoding process to determine the integrity of the retrieved user data. If one or more errors are detected, such errors may be corrected.

Iterative decoding of data can involve considerable system overhead, such as processing time overhead, system resources overhead, and/or system components overhead (e.g., necessity to use additional hardware, firmware, etc.). Furthermore, storing parity data (e.g., in a memory array) can reduce memory space available for storage of user data. Accordingly, it can be advantageous for a data storage system to support different error code rates, code lengths, and/or different coding throughput speeds. For example, a data storage system can decode stored data having a relatively higher coding rate so that less parity data is used when a non-volatile memory is early in the lifecycle and thus has relatively higher retention and/or endurance. As non-volatile memory wears out over time, the data storage system can switch to decoding lower coding rates such that more parity data is generated to protect user data from errors. However, supporting multiple code rates, lengths, and/or throughput speeds can require adding and/or duplicating system components (hardware, firmware, etc.).

Embodiments of the present invention are directed to a decoder supporting multiple code rates and code lengths. In one embodiment, the decoder can support multiple error code rates and/or error code lengths by using nominal or no redundancy of system components. For example, the decoder can be configured so that the existing decoding components can be used and/or reused for supporting various code rates and/or lengths. The decoder can further support multiple error coding throughput speeds by, for example, utilizing parallel computation techniques. In other words, the architecture of the decoder can be scalable and/or flexible. Accordingly, decoding efficiency and, consequently, data storage system performance can be increased without a substantial increase in the number and/or size of system components in data decoding.

System Overview

FIG. 1 illustrates a combination 100 of a host system 110 and a data storage system 120 that implements a decoder supporting multiple code rates and code lengths according to one embodiment of the invention. As is shown, the data storage system 120 (e.g., hybrid hard drive, solid state drive, etc.) includes a controller 130 and a storage medium 140. The storage medium 140 may comprise an array of non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. In some embodiments, the data storage system 120 can further comprise other types of storage, such as one or more magnetic media storage modules or other types of storage modules.

The controller 130 can be configured to receive data and/or storage access commands from a storage interface module 112 (e.g., a device driver) of the host system 110. Storage access commands communicated by the storage interface module 112 can include write data and read data commands issued by the host system 110. Read and write commands can specify a logical address (e.g., logical block addresses or LBAs) used to access the data storage system 120. The controller 130 can execute the received commands in the storage medium 140.

Data storage system 120 can store data communicated by the host system 110. In other words, the data storage system 120 can act as memory storage for the host system 110. To facilitate this function, the controller 130 can implement a logical interface. The logical interface can present to the host system 110 data storage system memory as a set of logical addresses (e.g., contiguous address) where user data can be stored. Internally, the controller 130 can map logical addresses to various physical locations or addresses in the storage medium 140 and/or other storage modules.

The controller 130 includes a decoder module 132 and an encoder module 134 configured to decode and encode data, respectively, stored in and retrieved from the storage medium 140. The decoder module 132 can further determine integrity of data retrieved from the storage medium 140 and perform, if necessary, error correction of retrieved data. In some embodiments, when the storage medium 140 is early in the lifecycle and thus has relatively higher retention and/or endurance, the controller 130 can direct the encoder module 134 to encode data using a relatively higher coding rate so that less parity data is used. As the storage medium 140 wears out over time, the controller 130 can direct the encoder module 134 to switch to lower encoding rates such that more parity data is generated to protect user data from errors. The controller 130 can store the coding rates for encoded data in the storage medium 140 or another storage module (not shown) so that the decoder module 132 can later access the information to decode the encoded data. In some embodiments, the controller 130 can track one or more quality metrics for blocks of memory (e.g., a block can correspond to a smallest unit of flash memory that can be erased in a single operation, atomically, or as a unit) or another granularity of memory. Consequently, when a number of bit errors for data units read from a block or other granularity of memory exceeds a threshold, the controller 130 can determine to encode and/or decode data stored to the one block or other granularity of memory at a lower coding rate.

Overview of Low-Density Parity-Check (LDPC) Coding

In one embodiment, the decoder module 132 and the encoder module 134 can utilize low-density parity-check (LDPC) codes for decoding and/or generating parity data, respectively. LDPC codes can be decoded using a decoding matrix H and generated using a corresponding generating matrix G.

Figure 2:
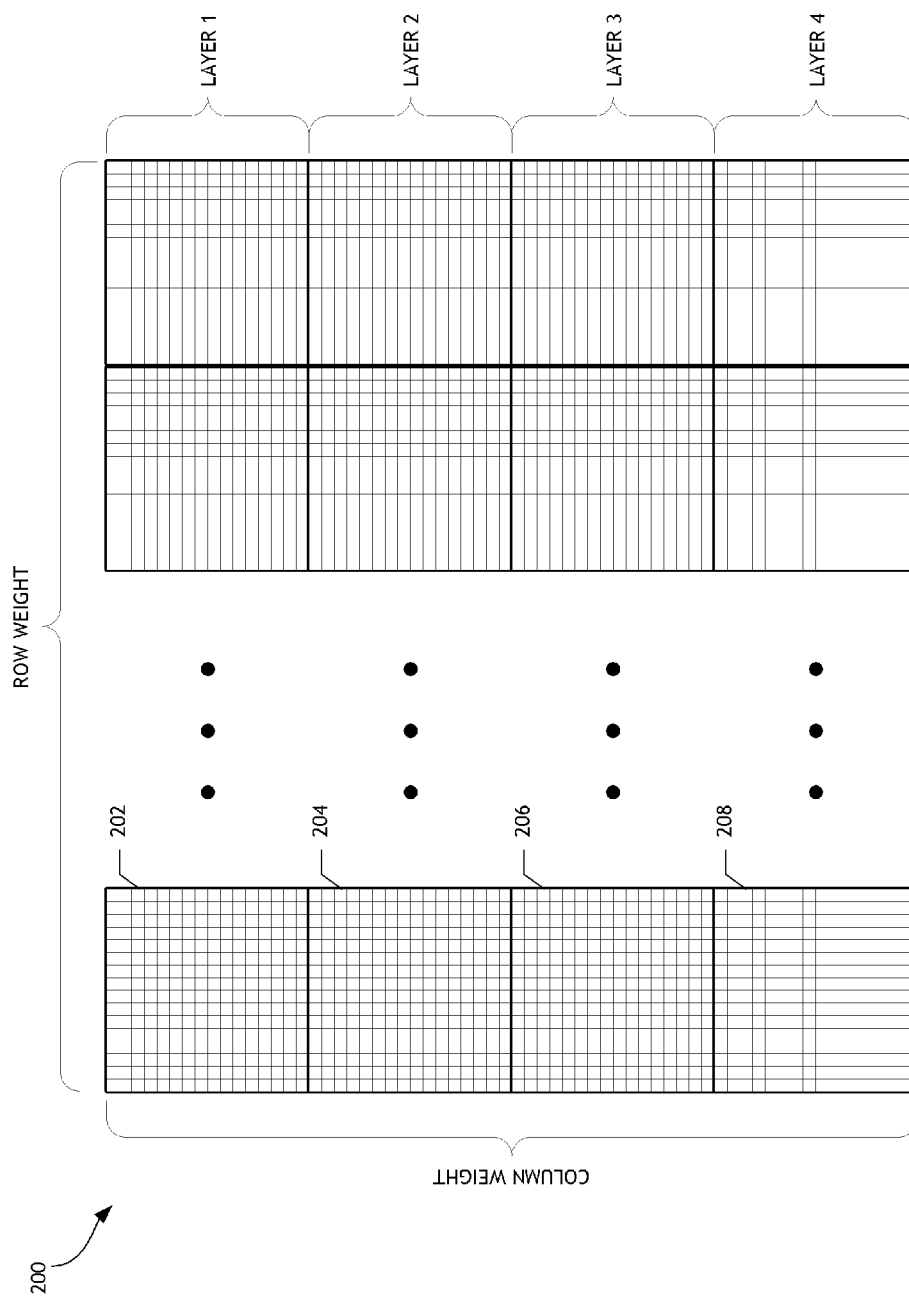
FIG. 2 illustrates a decoding matrix used for decoding data according to one embodiment of the invention.

FIG. 2 illustrates a decoding matrix 200 used for decoding data according to one embodiment of the invention. The decoding matrix 200 represents an example decoding matrix H, which has a column weight of four as H is a quasi-cyclic (QC) LDPC matrix (i.e., four layers) and includes multiple sub-matrixes, such as sub-matrixes 202, 204, 206, and 208, which may be termed P sub-matrixes. The column weigh may vary if other types of H matrixes are used. The multiple sub-matrixes may each have a size of P bits×P bits. P may be an integer value, for example, such as 128, 256, 350, 512, 1024, etc. The multiple sub-matrixes can be identity matrixes rotated by values where each row of one sub-matrix is shifted or rotated by the same number of columns (e.g., each sub-matrix can be a circulant matrix). The decoding matrix 200 further has a row weight. The row weight can equal the number of sub-matrixes per layer in the case of a QC-LDPC matrix. Other cases may have a different row weight depending on the type of matrixes used. In some embodiments, the decoding matrix 200 may not include a NULL sub-matrix. Although the decoding matrix 200 is illustrated with a column weight equal to four, in some embodiments, the decoding matrix 200 can have a column weight less than or greater than four, such as a column weight equal to three or five, for example. Each different decoding matrix size can correspond to and enable decoding of data units having different amounts of parity.

The decoding matrix 200 can be used in layered, iterative quasi-cyclic LDPC decoding where a layered approach or layer decoding operations are used to decode data retrieved from a storage medium. The retrieved data can be input to a decoder, such as the decoder module 132, in portions having a length equal to one of multiple code word lengths. The row weight of the decoding matrix can equal the code word length for encoded data in terms of a number of sub-matrixes in the decoding matrix. By changing the P sub-matrix size or column weight of the decoding matrix used to decode data, data having different code rates can be decoded. By changing the row weight of the decoding matrix used to decode data, data for different memory page formats can be coded. In some embodiments, the code word length used to decode data can depend on an E-page size (e.g., an error correcting code page size or a defined grouping of memory for a non-volatile memory array) or NAND flash page size of a memory of a data storage system, such as the data storage system 120.

The decoding matrix 200 can be used in solving a minimum-sum (min-sum) algorithm. As part of the min-sum algorithm, $R_{mj}$ may be defined to denote a check node log-likelihood ratio (LLR) message sent from a check node m to a variable node j. $L(q_{mj})$ may be defined to denote a variable node LLR message sent from the variable node j to the check node m. $L(q_j)(j=1, \ldots, N)$ may be defined to represent the a posteriori probability ratio (APP messages) for the variable nodes. The APP messages can be initialized with the corresponding a priori (channel) reliability value of the coded bit j. For each variable node j of a current horizontal layer of the decoding matrix 200, messages $L(q_{mj})$ that correspond to a particular check equation m are computed according to Equation 1.

$$L(q_{mj}) = L(q_j) - R_{mj} \quad (1)$$

For each check node m, message $R_{mj}$, which can correspond to all variable nodes j that participate in a parity check equation, can be computed according to Equation 2.

$$R_{mj} \approx \Pi_{j' \in N(m)\setminus\{j\}} \text{sign}(L(qmj')) \times (\min_{j' \in N(m)\setminus\{j\}} |L(qmi')|) \quad (2)$$

The a posteriori probability APP messages in the current horizontal layer can be updated according to Equation 3.

$$L(q_j) = L(q_{mj}) + R_{mj} \quad (3)$$

A decision can be made after processing each horizontal layer of the decoding matrix 200 based on the sign of L(q), j= 1, . . . , N. If all parity check equations are satisfied, the decoding algorithm may stop. Otherwise, the min-sum algorithm of Equations 1, 2, and 3 can be repeated for a next horizontal layer. In some embodiments, decoding may continue until a predetermined maximum number of iterations is reached.

Decoder Supporting Multiple Code Rates

Figure 3:
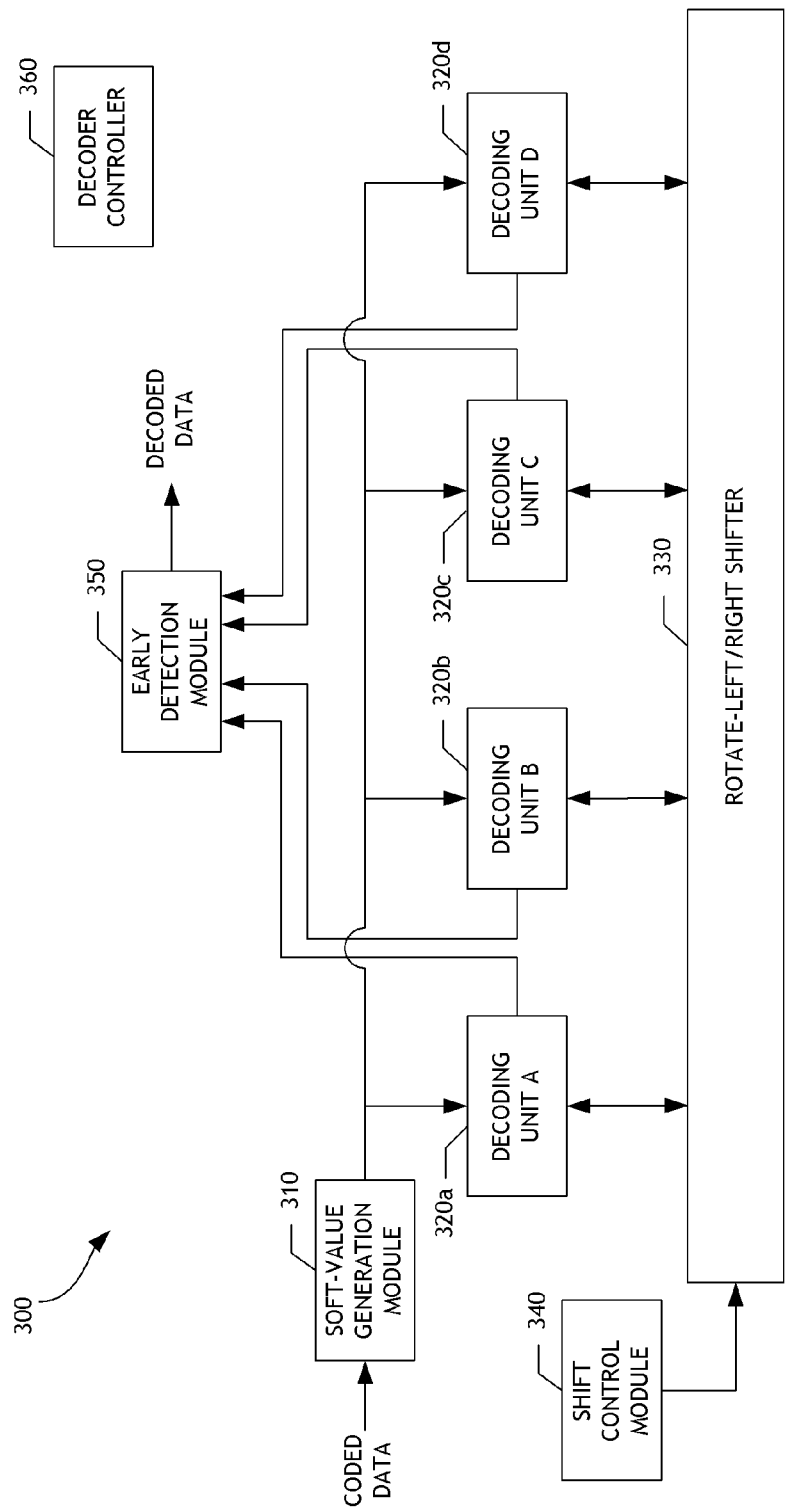
FIG. 3 illustrates a block diagram of a decoder according to one embodiment of the invention.

FIG. 3 illustrates a block diagram of a decoder 300 according to one embodiment of the invention. The decoder 300 can be a quasi-cyclic decoder, such as a quasi-cyclic low-density parity check (LDPC) decoder. The decoder 300 may correspond to the decoder module 132 of FIG. 1. The decoder 300 includes a decoder controller 360 that can manage operations of components of the decoder 300, as well as data exchange and iteration control. In some embodiments, the decoder controller 360 may be a separate lower-level controller from the controller 130 of FIG. 1. In other embodiments, the decoder controller 360 can be a part of the controller 130.

The decoder 300 includes a soft-value generation module 310 and multiple decoding units, including decoding unit A 320a, decoding unit B 320b, decoding unit C 320c, and decoding unit D 320d (collectively, decoding units 320). The soft-value generation module 310 can receive coded data retrieved from a storage medium and generate soft values (e.g., log-likelihood values or scaled values) as inputs for the decoding units 320. In some embodiments, the soft-value generation module 310 constructs soft values by reading the same memory page multiple times with different conditions (e.g., an adjusted voltage read threshold). The multiple read results can be combined in such a way that a final fixed-point represents a probability of 1 or 0. Further, in some embodiments, the soft-value generation module 310 can additionally or alternatively provide binary inputs to the decoding units 320. The soft-value generation module 310 may input data units having one of multiple code word lengths to the decoding units 320 for processing. Each decoding unit may include one or more memories (not shown) for storing a portion of or the entire data unit received from the soft-value generation module 310.

The decoding units 320 can be configured to iteratively decode data units according to a min-sum algorithm, such as based on Equations 1, 2, and 3. The decoding units 320 can decode data units that are encoded using one of multiple code word lengths or processing unit lengths. The decoding units 320 can operate in conjunction with rotate-left/right shifter 330 and the shift control module 340 to perform layer decoding operations using one of multiple decoding matrixes, such as the decoding matrix 200. After decoding using each layer or performing each layer decoding operation, the decoding units 320 can determine a minimum calculated value for each layer from the min-sum algorithm to determine a global minimum (e.g., a minimum of the minimums) for each layer. The global minimums for the layers can then be compared to determine a lowest or global minimum for all layers. The decoding units 320 can include one or more working memories (not shown) to store minimum calculated values or data during the decoding process, for example.

The decoding units 320 can output results, such as decoded data, from the layer decoding operations to an early detection module 350. The early detection module 350 can determine whether to terminate further decoding of the data unit based on the results and whether one or more parity check equations are satisfied by the results. In some embodiments, the early detection module 350 can include one or more individual modules configured to process portions of the results and determine whether to terminate for the decoding of the data unit.

The decoding units 320 can be configured to decode subsets of a data unit in parallel or substantially in parallel using subsets of a corresponding decoding matrix. In some embodiments, the decoding units 320 can each have a processing capacity of soft values or bits per clock cycle corresponding to the size of a smallest P sub-matrix size of a decoding matrix that is supported by the decoder 300. For example, the decoding units 320 can each process 256 soft values, 512 soft values, or 1024 soft values subsets of the data unit per clock cycle when the size of the smallest P sub-matrix size supported is 256 bits×256 bits, 512 bits×512 bits, or 1024 bits× 1024 bits, respectively. The decoding units 320 may share values determined as part of a layer decoding operation, such as local determined minimums from decoding subsets of one layer of a data unit, to facilitate the parallel decoding and determining of a minimum calculated value for each layer. In some embodiments, one or more of the decoding units 320 share values when processing a data unit having one length and not another length. The communication of values is described in more detail with respect to FIG. 4.

As a result of communicating values between the decoding units, the decoding units 320 can together decode data units having different code word lengths and code rates although each individual decoding unit may have a fixed data capacity per clock cycle. Depending on a sub-matrix size of a decoding matrix used to decode a data unit, each decoding unit can determine whether a value from a layer decoding operation of the data unit may be used by other decoding units to successfully process the layer. If the value may be used by another decoding unit, a decoding unit may transmit the value to one or more other decoding units. In turn, the decoding unit can also receive values from other decoding units. By communicating the values, the decoding units 320 can effectively decode the data unit as if one decoding unit were used rather than four. Moreover, the decoding units 320 can maintain a throughput for data units having different code word lengths and code rates.

The rotate-left/right shifter 330 can be configured to shift or rotate (e.g., to the left or the right) soft values or bits of portions of data units according to instructions from the shift control module 340. The shift control module 340 can determine or look-up a corresponding decoding matrix from a memory (not shown) for decoding particular data units. Based on the corresponding decoding matrix, the shift control module 340 can direct the rotate-left/right shifter 330 to process data units using a particular granularity and shift portions of data units an amount based on the size and contents of sub-matrixes of a decoding matrix used to decode data units (e.g., a P sub-matrix size and rotation of an identity matrix). In some embodiments, the rotate-left/right shifter 330 can be a configurable Benes network or group of shift registers, and the rotate-left/right shifter 330 may support input data sizes of at least 256 soft values, 512 soft values, and 1024 soft values, for instance. In such embodiments, the Benes network can further include one or more smaller Benes networks connected to one another so as to function as a larger Benes network. In some example operations of the rotate-left/right shifter 330, the rotate-left/right shifter 330 can shift data unit portions having a size of 256 soft values, 512 soft values, or 1024 soft values. In a simple, illustrative example operation of the rotate-left/right shifter 330 shown below, the rotate-left/right shifter 330 can shift each row of a 1 bit×6 bits matrix one column to the right based on the contents of a sub-matrix of the decoding matrix.

$$[b_1 \ b_2 \ b_3 \ b_4 \ b_5 \ b_6] \xrightarrow{group \ of \ 6 \ values \ (shift \ right \ 1 \ position)} [b_6 \ b_1 \ b_2 \ b_3 \ b_4 \ b_5]$$

The rotate-left/right shifter 330 can shift data unit portions having different sizes or granularities corresponding to a decoding matrix sub-matrix size although the rotate-left/right shifter 330 may have a fixed capacity per clock cycle. The shift control module 340 may direct the rotate-left/right shifter 330 to consider different portions of data processed by the rotate-left/right shifter 330 as different rotation units. Thereby, the shift control module 340 can direct the shifting of different portions of the data independently. In another simple, illustrative example operation of the rotate-left/right shifter 330 shown below, the rotate-left/right shifter 330 can independently shift two 1 bit×3 bits matrixes one column to the right based on the contents of two sub-matrixes of the decoding matrix.

$$[b_1\ b_2\ b_3\ b_4\ b_5\ b_6] \xrightarrow{\substack{\text{group of 3 values}\\(\text{shift right 1 position, shift right 2 positions})}} [b_3\ b_1\ b_2\ b_5\ b_6\ b_4]$$

In one example layer decoding operation, the decoding units 320 are configured to decode subsets of a data unit according to a min-sum algorithm. Initially, the decoding units 320 retrieve from an internal or working memory a portion of the data unit received from the soft-value generation module 310. The decoding units 320 provide the portion of the data unit to the rotate-left/right shifter 330. The rotate-left/right shifter 330, under control of the shift control module 340, shifts each portion of the data unit according to a corresponding portion of a decoding matrix, such as a P sub-matrix. For example, if each data unit portion has a size of 256 soft values, a corresponding 256 bits×256 bits P sub-matrix portion of a decoding matrix can indicate to treat the 256 soft values data unit portion as a rotation unit and shift the portion of the data unit a particular amount based on the rotation of the corresponding portion of the decoding matrix. In another example, if each data unit portion has a size of 512 soft values, the corresponding 512 bits×512 bits P sub-matrix portion of the decoding matrix can indicate to treat the 512 soft values data unit portion as a rotation unit and shift the portion of the data unit a particular amount based on the rotation of the corresponding portion of the decoding matrix. In effect, the rotate-left/right shifter 330 may perform matrix multiplication of each portion of the data unit and the corresponding portion of the decoding matrix. The rotate-left/right shifter 330 then passes subsets of each shifted data unit portion to each decoding unit. Each decoding unit performs the min-sum algorithm and thus calculates a minimum value corresponding to decoding each subset. Additional subsets of data unit portions are then provided to the decoding units 320 and processed, and this process is repeated until the decoder 300 has processed the entire data unit using one layer of the decoding matrix. In a next example layer decoding operation, the decoder similarly processes the entire data unit and a next layer of the decoding matrix.

In some embodiments, a number of decoding units can be selected in accordance with a desired throughput. For example, the number of decoder units can be 1, 2, 3, or 4 (as illustrated in FIG. 3), and so on. Further, in one embodiment, the upper limit on the number of decoder units can be selected as the number of sub-matrixes in one or more decoding matrixes which are supported by one or more of the decoding units 320 or the rotate-left/right shifter 330.

Figure 4:
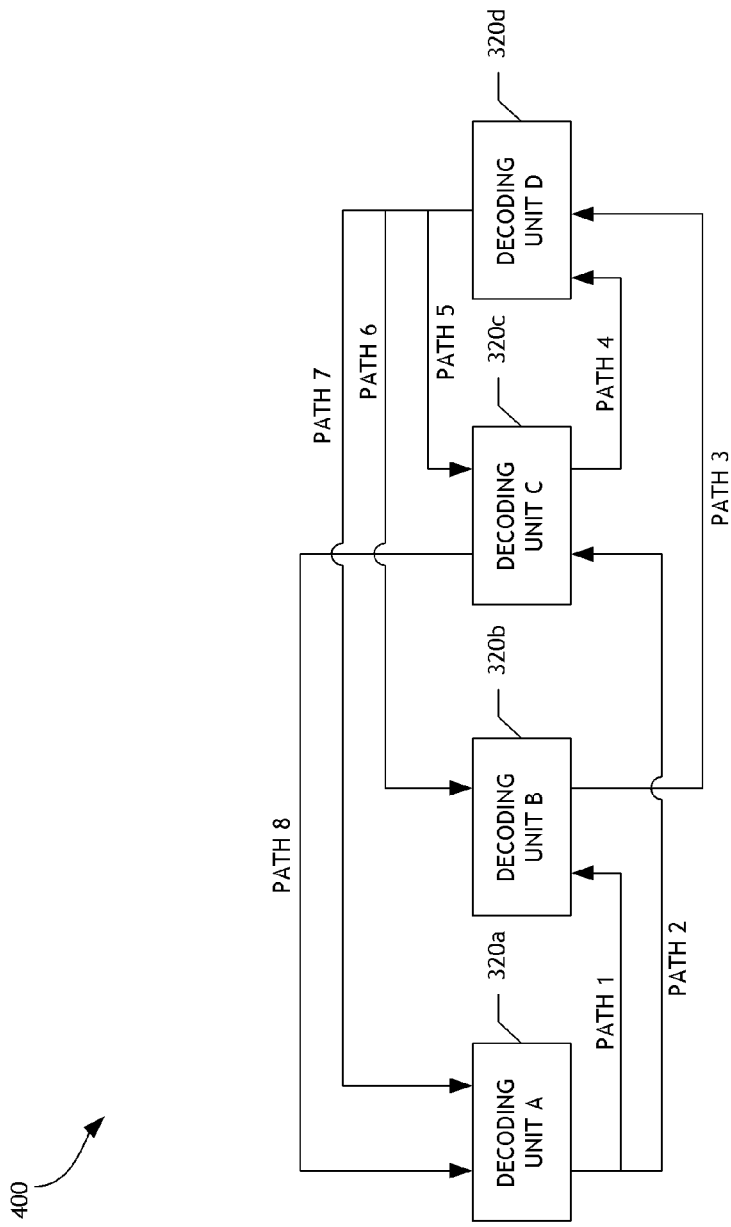
FIG. 4 illustrates a block diagram of a portion of the decoder of FIG. 3 according to one embodiment of the invention.

FIG. 4 illustrates a block diagram of a portion 400 of the decoder 300 of FIG. 3 according to one embodiment of the invention. The portion 400 includes the decoding units 320 of FIG. 3. In FIG. 4, eight communication paths are illustrated between the decoding units 320. The paths denote transmission paths which the decoding units 320 can use to communicate values determined as part of a layer decoding operation. The paths may facilitate parallel processing of subsets of a data unit while enabling the decoder 300 to process data units having one of multiple code word lengths. In some embodiments, the decoding units 320 can be connected by other or fewer transmission paths than are illustrated in FIG. 4.

The decoding units 320 can process a data unit having portions which are one of multiple sizes, for example, such as sizes equal to 256 soft values, 512 soft values, and 1024 soft values. In one example, each decoding unit, such as decoding unit A 320a, may have a fixed decoding capacity of 256 soft values per clock cycle. By managing decoding of subsets of the data unit by each decoding unit and, in some cases, communicating the results of decoding via Paths 1-8, the decoding units 320 can nonetheless decode different subset sizes of data units in parallel.

In one example, the decoding units 320 decode a data unit having a corresponding decoding matrix with a P sub-matrix size of 256 bits×256 bits, and each decoding unit processes a 256 soft values subset of the data unit for each clock cycle. Each of the decoding units 320 can store a minimum calculated value from decoding subsets of the data unit using one layer of the decoding matrix. After completing the decoding using the one layer, decoding unit A 320a can transmit its calculated minimum value via Path 1 to decoding unit B 320b, and decoding unit C 320c can transmit its calculated minimum value via Path 4 to decoding unit D 320d. Decoding unit B 320b and decoding unit D 320d can individually compare their own calculated minimum value from decoding with the calculated value from the other decoding unit to determine a lowest minimum. Then, decoding unit B 320b can transmit the lowest minimum of the values determined by decoding unit A 320a and decoding unit B 320b to decoding unit D 320d via Path 3. Decoding unit D 320d can then compare the calculated minimum values and determine a global minimum calculated value for the one layer. Next, decoding unit D 320d can transmit the global minimum calculated value to decoding unit A 320a, decoding unit B 320b, and decoding unit C 320c via Paths 5, 6, and 7, respectively.

In another example, the decoding units 320 decode a data unit having a corresponding decoding matrix with a P sub-matrix size of 512 bits×512 bits, and each decoding unit processes a 256 soft values subset of the data unit each clock cycle. Each of the decoding units 320 can decode and store a minimum calculated value from decoding the subsets of the data unit using one layer of the decoding matrix. After completing the decoding using the one layer, decoding unit A 320a can transmit its calculated minimum value via Path 2 to decoding unit C 320c, and decoding unit B 320b can transmit its calculated minimum value via Path 3 to decoding unit D 320d. Decoding unit C 320c and decoding unit D 320d can individually then compare their own calculated minimum value from decoding with the calculated value from the other decoding unit to determine a global minimum calculated value for the one layer. Next, decoding unit C 320c and decoding unit D 320d can transmit the global minimum calculated value to decoding unit A 320a and decoding unit B 320b via Paths 6 and 8, respectively.

In yet another example, the decoding units 320 decode a data unit having a corresponding decoding matrix with a P sub-matrix size of 1024 bits×1024 bits, and each decoding unit processes a 256 soft values subset of the data unit each clock cycle. Each of the decoding units 320 can decode and store a minimum calculated value from decoding the subsets of the data unit using one layer of the decoding matrix. After completing the decoding using the one layer, the decoding units 320 may not transmit minimum calculated values since each decoding unit may already have independently calculated the global minimum for the one layer during decoding.

Table 1 below summarizes the example active communication paths from the previous examples where each decoding unit is configured to decode 256 soft values per cycle. The active communication paths can be determined based on the P sub-matrix size of a decoding matrix used to decode a data unit.

TABLE 1

| P Sub-matrix Size | Active Minimum Value Communication Paths | Active Result Value Communication Paths |
|---|---|---|
| 256 bits × 256 bits | Paths 1, 3, and 4 | Paths 5, 6, and 7 |
| 512 bits × 512 bits | Paths 2 and 3 | Paths 6 and 8 |
| 1024 bits × 1024 bits | None | None |

Decoding Processes

Figure 5:
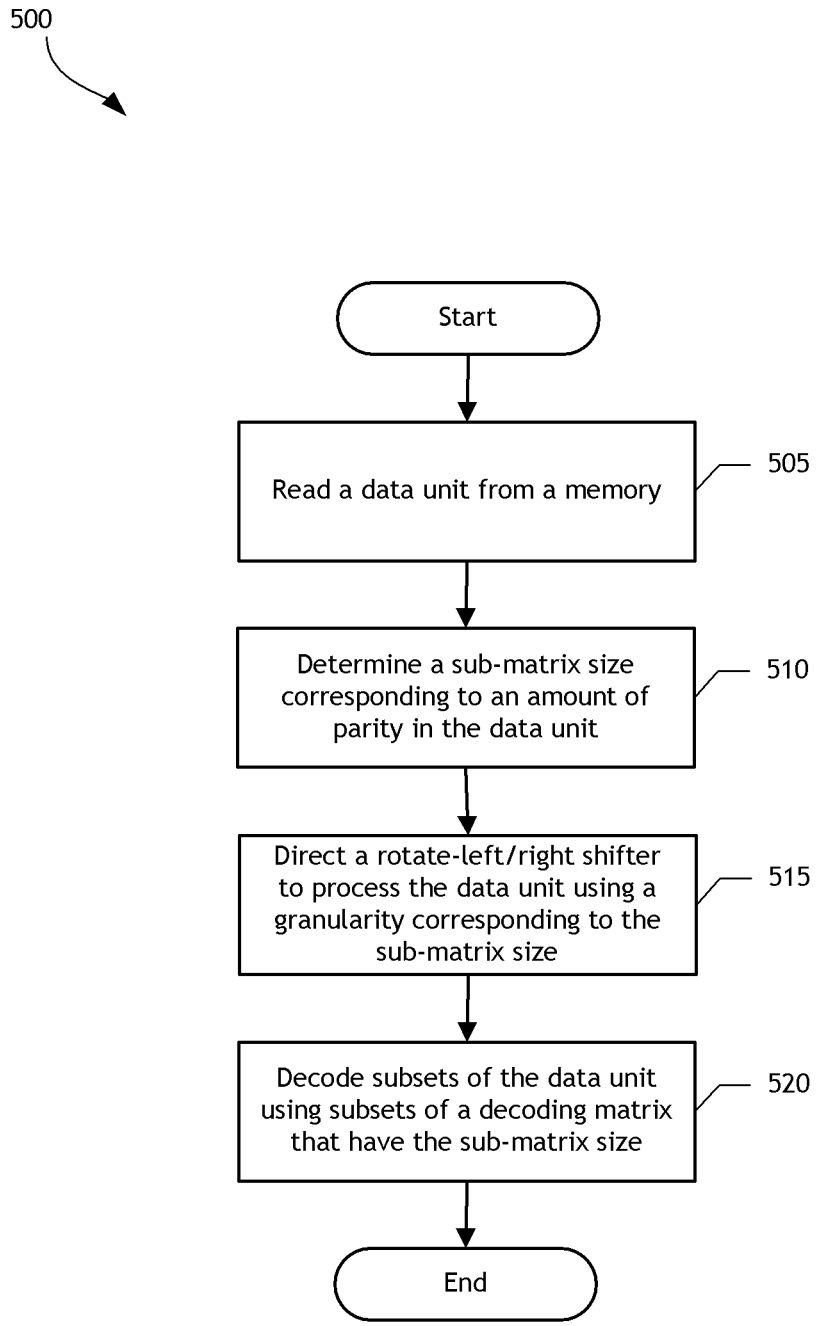
FIG. 5 is a flow diagram illustrating a process of decoding a data unit according to one embodiment of the invention.

FIG. 5 is a flow diagram illustrating a process of decoding a data unit according to one embodiment of the invention. In some embodiments, the controller 130 and/or decoder module 132 of FIG. 1 is configured to perform the process 500.

At block 505, the process 500 reads or retrieves a data unit from a memory. At block 510, the process 500 determines a sub-matrix size corresponding to an amount of parity in the data unit. The sub-matrix size can be determined by performing a look-up using a coding information table stored in memory. In one implementation, the decoder controller 360 of the decoder 300 is configured to perform the look-up. In another implementation, the controller 130 is configured to perform the look-up.

At block 515, the process 500 directs a rotate-left/right shifter to process the data unit using a granularity corresponding to the sub-matrix size. The rotate-left/right shifter may, as a result, consider different portions of data processed by the rotate-left/right shifter as different rotation units and shift of the portions independently based on a rotation of a particular sub-matrix. For example, if the rotate-left/right shifter is a 1024 soft-value capacity Benes network and a current sub-matrix size is 256 bits×256 bits, the rotate-left/right shifter may simultaneously process at least four 256 soft values portions of data. The rotate-left/right shifter can then independently shift at least four portions of data. As another example, if the rotate-left/right shifter is a 1024 soft-value capacity Benes network and a current sub-matrix size is 1024 bits×1024 bits, the rotate-left/right shifter may process the one 1024 soft values portion of data. In such case, the rotate-left/right shifter can shift the entire one portion of data. At block 520, the process 500 decodes subsets of the data unit using subsets of a decoding matrix that have the sub-matrix size or P sub-matrix size. In some embodiments, the decoding matrix may correspond to the amount of parity in the data unit.

Figure 6:
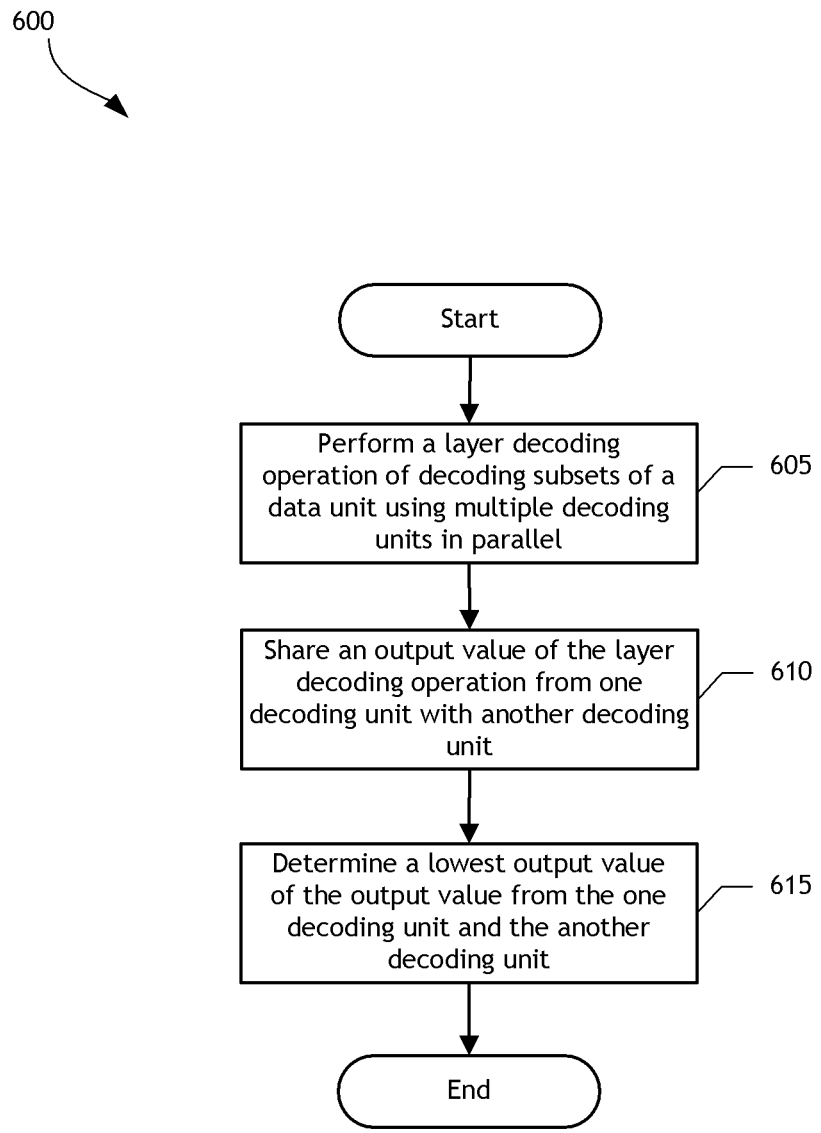
FIG. 6 is a flow diagram illustrating a process of managing parallel processing of a layer decoding operation according to one embodiment of the invention.

FIG. 6 is a flow diagram illustrating a process of managing parallel processing of a layer decoding operation according to one embodiment of the invention. In some embodiments, the controller 130 and/or decoder module 132 of FIG. 1 is configured to perform the process 600.

At block 605, the process 600 performs a layer decoding operation of decoding subsets of a data unit using multiple decoding units in parallel. For example, each of the decoding units 320 of FIG. 3 can process a different 256 soft values subset of one data unit each clock cycle. The decoding units 320 can repeat this process for other subsets of the data unit and together process all subsets of the data unit using one layer of a decoding matrix, such as decoding matrix 200.

At block 610, the process 600 shares an output value of the layer decoding operation from one decoding unit, such as the decoding unit A 320a of FIG. 3, with another decoding unit, such as the decoding unit C 320c of FIG. 3. The output value can include a minimum calculated value for the layer and be used as part of solving a min-sum algorithm. For example, the decoding unit A 320a can transmit its calculated value via Path 2 illustrated in FIG. 4 to the decoding unit C 320c.

At block 615, the process 600 determines a lowest output value of the output value from the one decoding unit and the another decoding unit. For example, the decoding unit C 320c can determine a lowest calculated value of its calculated value for the layer and the calculated value from the decoding unit A 320a for the layer.

Although the example process 600 illustrates transmission of an output value from one decoding unit to another decoding unit, in some embodiments, output values can be passed between or back-and-forth from one or more decoding units to facilitate parallel processing of subsets of the data unit. In addition, blocks 605, 610, and 615 can be repeated to perform a layer decoding operation for each layer of a multi-layer decoding matrix. If a decoding operation may not be successful after performing the operation for all layers, the process 600 may then perform another iteration of decoding the data unit, again repeating blocks 605, 610, and 615, to attempt to successfully decode data.

Other Variations

Those skilled in the art will appreciate that in some embodiments, other suitable error correction mechanisms can be used in addition to and/or in place of LDPC coding. For example, Hamming coding, turbo coding, BCH coding, and the like can be used. Further, any suitable unit or grouping of data, such as octet, nibble, word, byte, etc., can be used in addition to or in place of a bit of user data. Moreover, the actual steps taken in the disclosed processes, such as the processes illustrated in FIGS. 5 and 6, may differ from those shown in the Figures. Additional system components can be utilized, and disclosed system components can be combined or omitted. Depending on the embodiment, certain of the steps described above may be removed, others may be added. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A solid-state storage system, comprising:
a non-volatile memory array configured to store a data unit in a block of memory;
a rotate-left/right shifter configured to transform values; and
a controller configured to read data values of the data unit from the non-volatile memory array and decode the data values using low-density parity-check (LDPC) quasi-cyclic coding by at least:
determining a matrix size corresponding to an amount of parity in the data unit, the amount of parity depending at least in part on a quality metric of the block of memory; and
directing the rotate-left/right shifter to:
load the data values, and
based at least on the matrix size, independently shift each set of one or more non-overlapping sets of the data values,
wherein a number of the one or more non-overlapping sets depends at least in part on the matrix size, and
wherein when the number of the one or more non-overlapping sets comprises a first number of sets, the controller is configured to direct the rotate-left/right shifter to independently shift each set of the first number of sets, and when the number of the one or more non-overlapping sets comprises a second number of sets greater than the first number of sets, the controller is configured to direct the rotate-left/right shifter to independently shift each set of the second number of sets by a determined amount.

2. The solid-state storage system of claim 1, wherein the rotate-left/right shifter comprises a Benes network.

3. The solid-state storage system of claim 2, wherein an encoding of the data unit corresponds to an H matrix having a first P sub-matrix size and a first column weight, and the first matrix size is equal to the first P sub-matrix size.

4. The solid-state storage system of claim 3, wherein the controller is further configured to direct the rotate-left/right shifter to independently shift the one or more non-overlapping sets based at least in part on a selected H matrix of a plurality of H matrixes, the selected H matrix comprising sub-matrixes having the first matrix size, each of the plurality of H matrixes comprising sub-matrixes having one of a plurality of P sub-matrix sizes.

5. The solid-state storage system of claim 4, wherein the sub-matrixes of the plurality of H matrixes comprise identity matrixes rotated by values, and the plurality of P sub-matrix sizes comprises 256 bits×256 bits, 512 bits×512 bits, and 1024 bits×1024 bits.

6. The solid-state storage system of claim 3, wherein the controller is further configured to adjust at least one of the first P matrix size and the first column weight to reduce a code rate for coding data written to the block of memory based at least in part on the quality metric.

7. The solid-state storage system of claim 3, wherein the controller is further configured to:
detect a number of bit errors when the data unit is decoded; and
based on a comparison between the number of bit errors and a threshold depending on the first P matrix size and the first column weight, adjust at least one of the first P matrix size and the first column weight to reduce a code rate for coding data written to the block of memory.

8. In a data storage system comprising a controller, a method of decoding data performed under control of the controller, the method comprising:
determining a matrix size corresponding to an amount of parity in a data unit read from a block of memory of a non-volatile memory array, the amount of parity depending at least in part on a quality metric of the block of memory; and
directing a rotate-left/right shifter of a low-density parity-check (LDPC) quasi-cyclic decoder to load data values of the data unit and, based at least on the matrix size, independently shift each set of one or more non-overlapping sets of the data values,
wherein a number of the one or more non-overlapping sets depends at least in part on the matrix size, and
wherein when the number of the one or more non-overlapping sets comprises a first number of sets, directing the rotate-left/right shifter to independently shift each set of the first number of sets, and when the number of the one or more non-overlapping sets comprises a second number of sets greater than the first number of sets, directing the rotate-left/right shifter to independently shift each set of the second number of sets by a different amount.

9. The method of claim 8, wherein the rotate-left/right shifter comprises a Benes network.

10. The method of claim 9, wherein an encoding of the data unit corresponds to an H matrix having a first P sub-matrix size and a first column weight, and the matrix size is equal to the first P sub-matrix size.

11. The method of claim 10, further comprising directing the rotate-left/right shifter to independently shift the one or more non-overlapping sets based at least in part on a selected H matrix of a plurality of H matrixes, the selected H matrix comprising sub-matrixes having the matrix size, each of the plurality of H matrixes comprising sub-matrixes having one of a plurality of P sub-matrix sizes.

12. The method of claim 11, wherein the sub-matrixes of the plurality of H matrixes comprise identity matrixes rotated by values, and the plurality of P sub-matrix sizes comprises 256 bits×256 bits, 512 bits×512 bits, and 1024 bits×1024 bits.

13. The method of claim 10, further comprising adjusting at least one of the first P matrix size and the first column weight to reduce a code rate for coding data written to the block of memory based at least in part on the quality metric.

14. The method of claim 10, further comprising:
detecting a number of bit errors when the data unit is decoded; and
based on a comparison between the number of bit errors and a threshold depending on the first P matrix size and the first column weight, adjusting at least one of the first P matrix size and the first column weight to reduce a code rate for coding data written to the block of memory.

15. A solid-state storage system, comprising:
a non-volatile memory array; and
a controller configured to iteratively decode data units read from blocks of memory of the non-volatile memory array, the controller comprising a plurality of decoding modules configured to decode a first data unit of the data units by decoding at least some subsets of the first data unit in parallel, each decoding module of the plurality of decoding modules configured to decode at least one subset of the first data unit using at least one sub-matrix of a plurality of sub-matrixes, the plurality of sub-matrixes forming a decoding matrix,
wherein a first decoding module of the plurality of decoding modules is configured to share with a second decoding module of the plurality of decoding modules an output value from each layer decoding operation of the first data unit when an individual sub-matrix of the plurality of sub-matrixes is a first size, and the first decoding module is configured to not share with the second decoding module the output value from each layer decoding operation of the first data unit when the individual sub-matrix is a second size different from the first size, and wherein the plurality of decoding modules is configured to support decoding of the data units using decoding sub-matrixes having a plurality of different sizes including the first and second sizes.

16. The solid-state storage system of claim 15, wherein the decoding matrix comprises a low-density parity-check (LDPC) code matrix, and the plurality of sub-matrixes comprises a plurality of identity matrixes rotated by values.

17. The solid-state storage system of claim 15, wherein each decoding module of the plurality of decoding modules is further configured to perform a minimum-sum algorithm to determine a calculated value for each subset of the first data unit.

18. The solid-state storage system of claim 17, wherein when the individual sub-matrix is the first size, the first decoding module is configured to share at least one of its calculated values with the second decoding module, and the second decoding module is configured to compare at least one of its calculated values with the at least one calculated value shared by the first decoding module to determine a lowest calculated value.

19. The solid-state storage system of claim 15, wherein the first size comprises fewer matrix rows and columns than the second size.

20. In a data storage system comprising a controller, a method of decoding data, the method comprising:
reading data units from blocks of memory of a non-volatile memory array;
using a plurality of decoding modules comprising a first decoding module and a second decoding module, performing in parallel iterations of decoding subsets of a first data unit of the data units using sub-matrixes of a first decoding matrix of a plurality of decoding matrixes;
controlling, according to a size of an individual sub-matrix of the sub-matrixes, whether an output value from each layer decoding operation of the first data unit by the first decoding module is shared with the second decoding module;
when the individual sub-matrix is a first size, sharing with the second decoding module the output value from each layer decoding operation of the first data unit by the first decoding module; and
when the individual sub-matrix is a second size comprising more matrix rows and columns than the first size, not sharing with the second decoding module the output value from each layer decoding operation of the first data unit by the first decoding module,
wherein the method is performed under control of the controller.

21. The method of claim 20, further comprising:
using each of the plurality of decoding modules, determining calculated values using a minimum-sum algorithm for each subset of the first data unit;
when the individual sub-matrix is the first size,
sharing at least one calculated value of the calculated values from the first decoding module with the second decoding module; and
comparing the at least one calculated value from the first decoding module with at least one calculated value of the calculated values determined by the second decoding module to determine a lowest calculated value.

22. The method of claim 21, wherein the plurality of decoding matrixes comprises a plurality of low-density parity-check (LDPC) code matrixes, and each of the plurality of LDPC code matrixes comprises a plurality of identity matrixes rotated by values.

* * * * *